United States Patent [19]

Ozutsumi et al.

[11] Patent Number: 5,726,380
[45] Date of Patent: Mar. 10, 1998

[54] THERMO-ELECTRIC POWER GENERATION USING POROUS METAL BLOCKS HAVING A PLURALITY OF THERMOCOUPLES CONNECTED IN SERIES

[75] Inventors: Michio Ozutsumi, Tokyo; Toshihiko Takemoto, Shin-Nanyo; Shinsuke Ohara, Kyoto, all of Japan

[73] Assignees: Nisshin Steel Co., Ltd., Tokyo, Japan; Ohara Metal Industries Co., Ltd., Kyoto-fu, Japan

[21] Appl. No.: 612,280

[22] Filed: Mar. 7, 1996

[30] Foreign Application Priority Data

| | | | |
|---|---|---|---|
| Mar. 9, 1995 | [JP] | Japan | 7-078262 |
| Mar. 15, 1995 | [JP] | Japan | 7-083260 |
| Sep. 22, 1995 | [JP] | Japan | 7-268049 |

[51] Int. Cl.$^6$ .......... H01L 35/02; H01L 35/12; H01L 35/32
[52] U.S. Cl. .......... 136/205; 136/208; 136/209; 136/210; 136/211; 136/224; 136/225; 136/236.1
[58] Field of Search .......... 136/225, 205, 136/208, 209, 210, 211, 212, 224, 236.1, 200

[56] References Cited

U.S. PATENT DOCUMENTS

| | | | |
|---|---|---|---|
| 1,526,641 | 2/1925 | Mulvany et al. | 136/225 |
| 1,618,743 | 2/1927 | Adams | 136/201 |
| 1,677,029 | 7/1928 | Fuller et al. | 136/211 |
| 2,139,504 | 12/1938 | King | 236/15 R |
| 2,490,196 | 12/1949 | Beach | 136/225 |
| 2,677,712 | 5/1954 | Biggle | 136/225 |
| 2,857,446 | 10/1958 | Imelmann | 136/211 |
| 3,070,645 | 12/1962 | Tracht | 136/208 |
| 4,095,998 | 6/1978 | Hanson | 136/208 |
| 4,218,266 | 8/1980 | Guazzoni et al. | 136/209 |
| 4,673,863 | 6/1987 | Swarbrick | 322/2 R |

FOREIGN PATENT DOCUMENTS 6302867   10/1994   Japan.

OTHER PUBLICATIONS

Julius Grant, ed., Hackh's Chemical Dictionary, 1969, p. 175, no month available.

Dahl, Andrew I., "Stability of Base–Metal Thermocouples in air from 800° to 2,200°F", Journal of Research of the National Bureau of Standards, vol. 24, Feb. 1940, pp. 205–224.

Ryozo Echigo, et al., "Sophisticated Thermoelectric Conversion Devices of Porous Materials By Super–Adiabatic . . . ", XI International Conference on Thermoelectrics, pp. 1–6, Oct. 7–9, 1992.

Katsunori Hanamura et al., "Superadiabatic Combustion in a Porous Medium", Int. J. Heat Mass Transfer, vol. 36, No. 13, Pp. 3201–3209, 1993.

*Primary Examiner*—Kathryn L. Gorgos
*Assistant Examiner*—Chrisman D. Carroll
*Attorney, Agent, or Firm*—Webb Ziesenheim Bruening Logsdon Orkin & Hanson, P.C.

[57] ABSTRACT

A thermo-electric power generating element has the structure that two kinds of metal sheets, or foils, which form a thermocouple combination are laminated together and alternately connected at one end and the other end so as to form a plurality of thermocouples connected in series. When hot junctions are held at a high temperature, a temperature gap along the thermal flux is generated in the sheets, or foils. Electromotive force at every thermocouple derived from the temperature gap is summed up to a voltage level effective for outputting electric power through takeoff leads. This power generator is useful for converting waste heat to electric power. When the thermocouple pile is made from corrugated sheets, or foils, electric power is outputted with high efficiency.

11 Claims, 11 Drawing Sheets

FIG.1

(PRIOR ART)

FIG.9 high temp. zone

DISTRIBUTION OF FUEL

TEMPERATURE DISTRIBUTION

THERMO-ELECTRIC POWER GENERATION USING POROUS METAL BLOCKS HAVING A PLURALITY OF THERMOCOUPLES CONNECTED IN SERIES

BACKGROUND OF THE INVENTION

1) Field of the Invention

The present invention relates to a fuel combustion-type thermo-electric power generating element composed of a porous block formed by laminating two kinds of metal sheets, or foils, to form a thermocouple combination. The present invention also relates to a thermo-electric power generator using the power generating element.

2) Prior Art

When two junctions between different metals or semiconductors have a temperature gap therebetween, an electromotive force is generated due to the Seebeck effect. A thermo-electric power generator which uses the electromotive force for directly converting thermal energy to electricity has a simplified structure, is small in size and is driven with less noise. Research for a suitable material for thermo-electric conversion has been continued in various fields, however, a material which meets the practical requirements, including costs, has not yet been developed. Consequently, although in various industrial fields thermo-electric power generation is regarded as an effective means for converting waste heat discharged from factories to electric power, its application is limited only to specified fields, such as a power source of a space craft.

Figure 1:
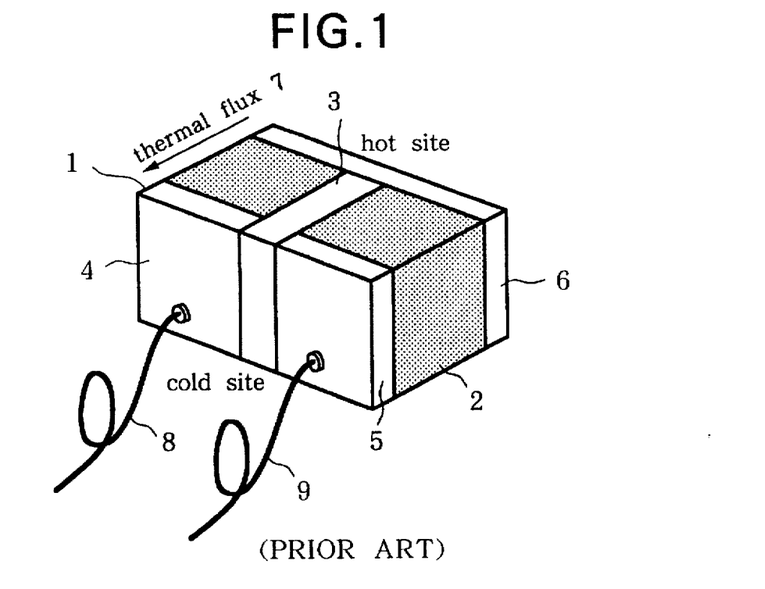
FIG. 1 is a schematic view illustrating a conventional thermo-electric power generator.

A conventional thermo-electric power generator is shown in FIG. 1. This power generator comprises a member 1, made of type-p thermo-electric material, coupled with another member 2, made of type-n thermo-electric material, through an electric insulator 3. A cold plus electrode 4 and a cold minus electrode 5 are connected to the faces of the members 1 and 2, respectively at one side, while a hot common electrode 6 is connected to the opposite faces of the members 1, 2 at the other side.

When the hot site of the element is heated, or heat is collected at the hot site, heat is diffused from the cold site by cooling or heat radiation and a thermal flux 7 is generated in the thermo-electric members 1, 2. As a result, an electromotive force derived from the temperature gap between the hot electrode 6 and the cold electrodes 4, 5 is generated and is outputted as electric power through takeoff leads 8, 9.

A thermo-electric power generator having a porous block for burning a fuel therein was proposed in Japanese Patent Application Laid-Open 6-302867. A heat generated by the combustion of the fuel in the porous block is confined in a narrow space due to the superadiabatic effect of the porous block and is outputted as electric power through electrodes connected to both faces of the porous block.

The same power generator has been proposed by Professor Echigo. In the proposed power generator, a temperature gap effective for outputting electric power can be generated by periodically switching the flow direction of premixed gas, see XI Intern. Conference on Thermoelectrics, Oct. 7–9, 1992.

The material to be used in the conventional thermo-electric power generation has a performance factor Z. The performance factor Z is defined by the formula of $Z=\alpha^2/\rho\lambda$, wherein $\alpha$ represents the Seebeck coefficient equal to thermo-electric voltage per temperature gap of 1° C., $\rho$ is electric resistance and $\lambda$ is the coefficient of thermal conductivity. According to the formula, a material which has a big Seebeck coefficient $\alpha$, a small electric resistance $\rho$ and a small coefficient of thermal conductivity $\lambda$ is suitable for thermo-electric power generation. The material should be of good heat resistance due to the atmosphere of use.

Various semiconductor materials have been recently developed which have big electromotive force and a big performance factor Z, especially $FeSi_2$ which has excellent heat resistance. However, such materials which satisfy the requirements for thermo-electric power generation have not been offered for practical use due to their expense and impracticability.

SUMMARY OF THE INVENTION

The present invention overcomes the aforementioned problems.

A first object of the present invention is to provide a new thermo-electric power generating element using two kinds of metal sheets, or foils, which form a thermocouple combination.

A second object of the present invention is to provide a gas-permeable porous block made from the metal sheets, or foils, forming the thermo-electric power generating element.

A third object of the present invention is to provide the thermo-electric power generating element which outputs electric power applicable for practical use with high efficiency.

A thermo-electric power generating element according to the present invention comprises a porous block having a plurality of thermocouples connected in series. The porous block is prepared by laminating two kinds of metal sheets, or foils, together and connecting them at one end and the other end alternatively so as to form a zigzag folded structure. Each sheet, or foil, is electrically insulated from the adjacent sheet, or foil, except the junction of the two, and a cavity which permits the passage of fuel gas is formed in the porous block.

The metal sheet, or foils, are preferably corrugated into a wave or concave-convex shape. Small holes which permit the passage of a fuel or combustion gas are formed in the sheets, or foils, to form a space for the passage of gas between adjacent sheets, or foils. The metal sheet, or foil, may be laminated to the adjacent sheet, or foil, with an angle between the directions of the wave or concave-convex shapes formed in the adjacent sheets, or foils. Takeoff leads are connected to both ends of the metal sheet, or foil, structure which is folded in the zigzag state.

The two kinds of metals for forming the porous blocks preferable, in combination, have an output ratio P of $1\times10^{-3}$ $w.m^{-1}.K^{-2}$ or more. The output ratio P is defined by the formula of:

$$P=\alpha^2/\rho$$

wherein $\alpha$ represents the Seebeck coefficient and $\rho$ is electric resistivity.

The porous block may be formed as a flat shape to be used as a partition wall or to be embedded in a partition wall to separate a high-temperature zone from a low-temperature zone.

The porous block may have the metal sheets, or foils, radially extending outwards and a hole at the center. In this case, the connected ends are located as cold junctions at the outside, while a high-temperature fluid is passed through the center hole.

The metal sheets, or foils, connected together at the ends may be formed into a block having a relatively minimum volume. This porous block is useful as the thermosensor which outputs big potential with high sensitivity.

Two porous blocks may be arranged in series along the flowing direction of a combustion improving gas. In this case, a fuel is supplied to a space between the porous blocks. Such a combustion improving gas, such as air, oxygen or oxygen-enriched air, may be alternately supplied along one direction and then along an opposite direction through the porous blocks, alternating at predetermined time intervals. The temperature gap along the flowing direction of the combustion gas in the porous blocks generated by the combustion of the supplied fuel is converted to electric power and outputted through takeoff leads.

DETAILED DESCRIPTION OF THE PREFERRED EMBODIMENTS

Figure 2:
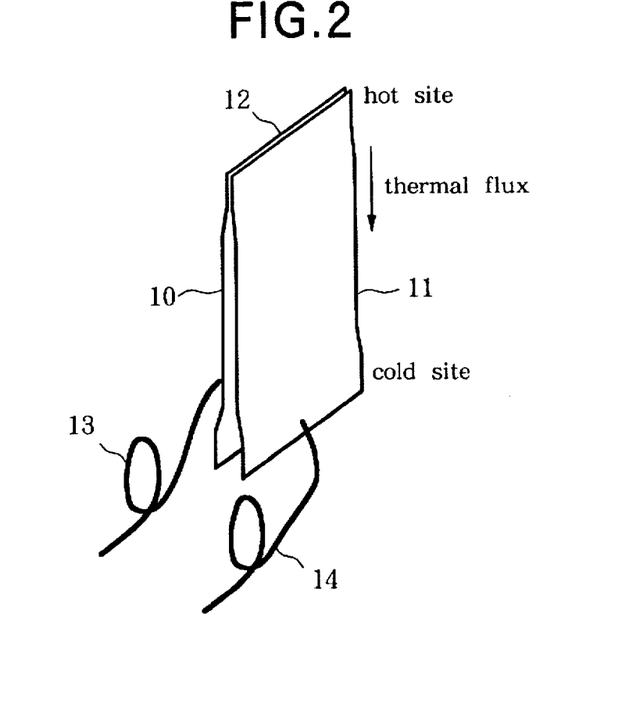
FIG. 2 is a view illustrating a thermocouple which principally constructs one unit of the thermoelectric power generating element according to the present invention.

Two kinds of metal sheets, or foils, 10, 11 form a thermocouple combination, such as ALUMEL/CHROMEL, iron/constantan (60% Cu-40% Ni alloy) or CHROMEL/constantan, and are connected at one end, as shown in FIG. 2. When the connected end, i.e., a hot junction 12, is held at a high temperature, thermal flux from the hot junction 12 to the other end is generated in the sheets 10, 11. Electric power originated in the temperature gap in the metal sheets 10, 11 is outputted through the takeoff leads 13, 14, connected to the cold site. The electric power outputted from one thermocouple is too tiny for practical use.

We believe the electromotive force of the thermocouples can be summed up to a level applicable for practical use, when a plurality of thermocouples are connected in series. The series of thermocouples is formed as follows.

Figure 3:
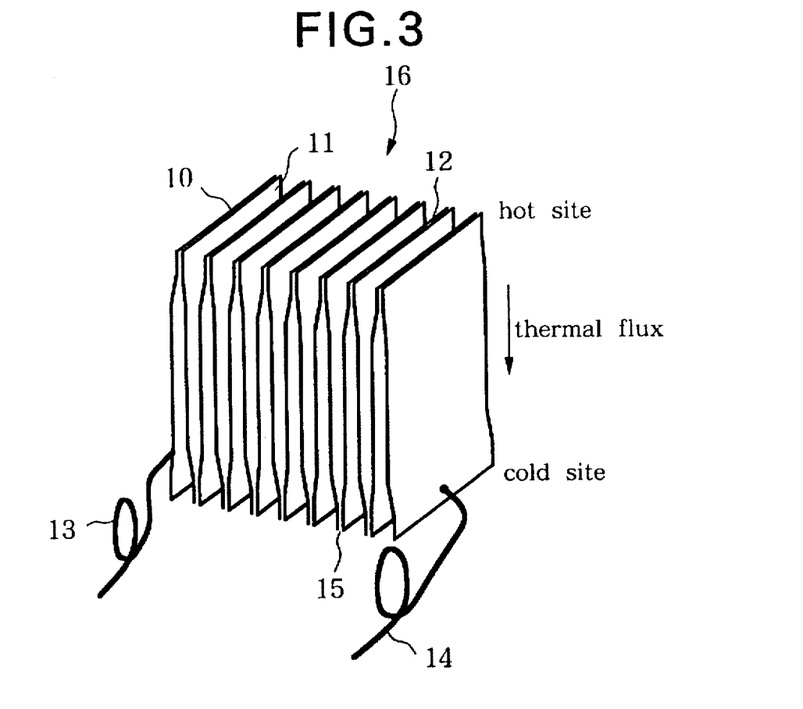
FIG. 3 is a view illustrating a thermo-electric power generating element according to the present invention.

A plurality of metal sheets 10, 11 are arranged in face-to-face contact with each other and connected at one end and the other end alternately to form hot junctions 12 and cold junctions 15, as shown in FIG. 3. The zigzag-folded thermocouple pile 16, in which a plurality of thermocouples are connected in series, is obtained in this way. The junctions 12, 15 may be formed by proper means, such as welding, pressure welding, brazing or soldering, to electrically alternately connect the metal sheets, or foils, 10, 11 at both ends.

After the metal sheets 10, 11 are connected together, it is necessary to form dielectric films on the surface of the metal sheets 10, 11. The dielectric films may be formed by proper means, such as thermal oxidation, ceramic coating or chemical treatment with an acid or the like. These means are selected in response to the property of the materials. For instance, firm dielectric films composed of alumina and chromium oxide, which have excellent insulating power, are easily formed by thermal oxidation where the combination of ALUMEL/CHROMEL forms the thermocouple. The insulating film does not necessarily have a high insulating property, since the voltage charged between the adjacent sheets 10, 11 is only several tens mV.

Since the thermocouple pile 16 has a plurality of thermocouples connected in series, electromotive forces generated at the thermocouples are collected together and outputted as electric power through the takeoff leads 13, 14. Consequently, a potential sufficient to output electric power is obtained, despite the combination of metals generating a relatively small electromotive force per thermocouple.

The thermocouple pile may be reformed to a proper shape in accordance with the intended use.

Figure 4:
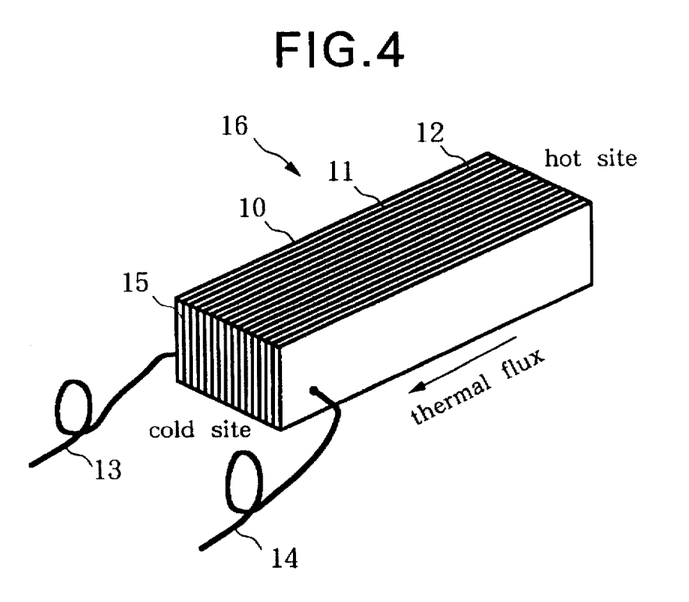
FIG. 4 is a view illustrating a thermo-electric power generator useful as a thermosensor.

For instance, when the thermocouple pile 16 is used as a thermosensor, the pile 16 is preferably formed to a minimum volume, as shown in FIG. 4. The thermosensor obtained in this way is very sensitive due to a high output voltage.

Figure 5:
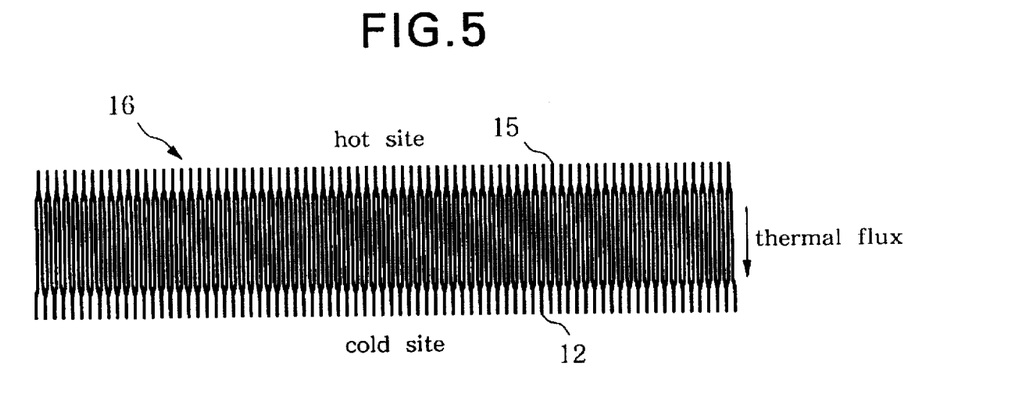
FIG. 5 is a view illustrating a thermo-electric power generator useful as a partition wall to separate a high-temperature zone from a low-temperature zone.
Figure 6:
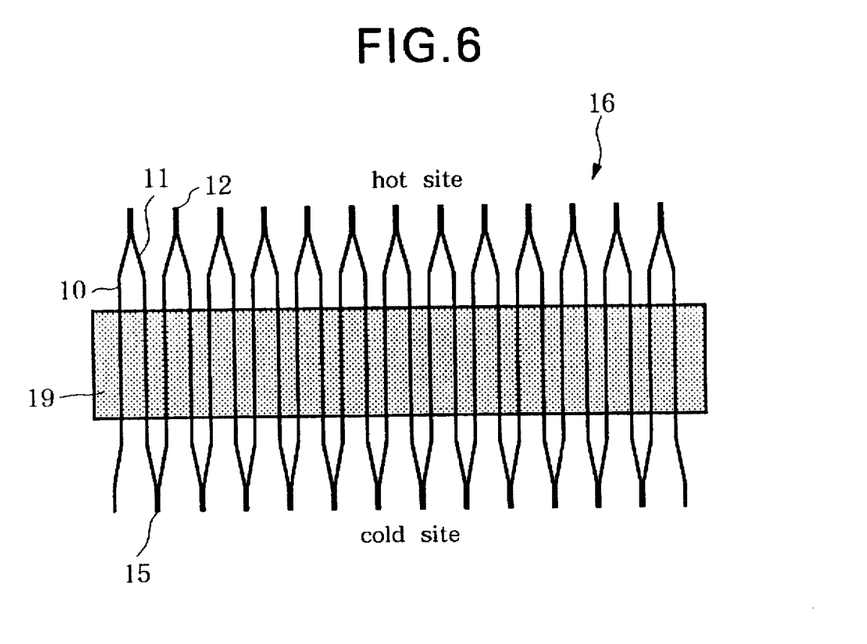
FIG. 6 is a view illustrating a thermo-electric power generator embedded in a partition wall.

The thermocouple pile 16 may be used as a partition wall (shown in FIG. 5) or embedded in a partition wall 19 (shown in FIG. 6) to separate a high-temperature zone from a lower-temperature zone. The hot junctions 12 are faced to the burners of a boiler, while the cold junctions are faced to a water tank. Thermal flux along the direction shown by the arrow is generated in the pile 16, and electric power in response to the temperature gap is outputted. When the metal sheets 10, 11 are partially elongated to form fins for collecting or discharging heat, the block made from such the metal sheets 10, 11 efficiently collects heat from or discharges heat to a gas or liquid surrounding the block.

Figure 7:
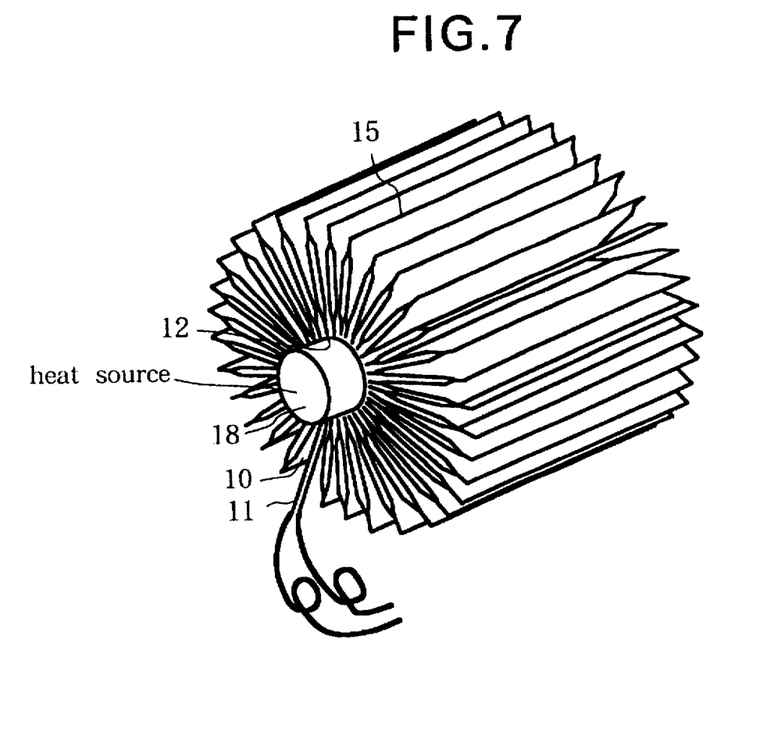
FIG. 7 is a view illustrating a tubular thermo-electric power generator having a center hole for the passage of hot gas.
Figure 8:
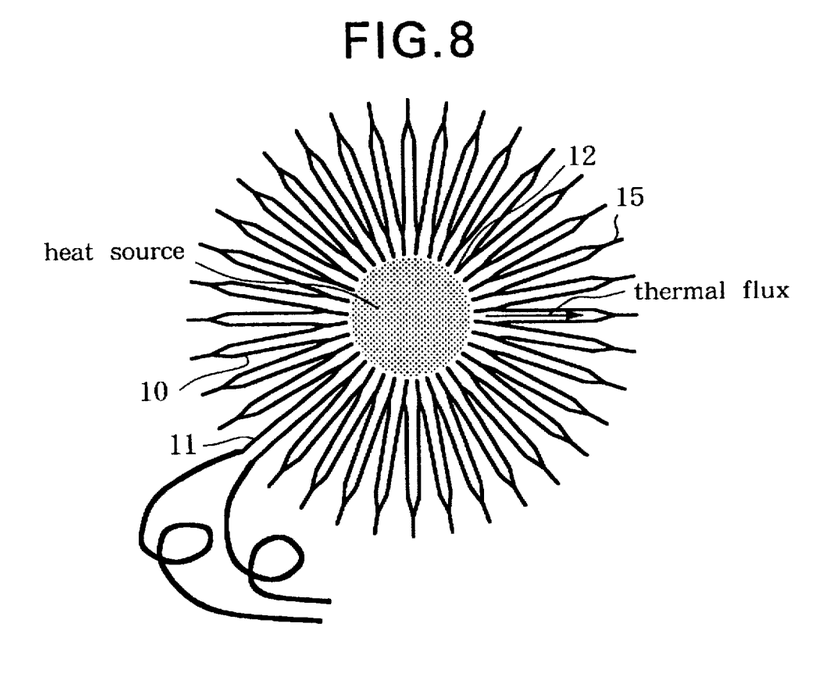
FIG. 8 is the sectional view of the tubular thermo-electric power generator shown in FIG. 7.

When a plurality of couples of the metal sheets 10, 11 are arranged in a radial configuration, as shown in FIGS. 7 and 8, electric power is outputted from a small heat source. In this case, the heat of waste gas passing through an exhaust pipe 18 located at the center is used as a heat source. Since the cold junctions 15 are radially directed outwards, thermal diffusion is effectively promoted so to enlarge the thermal flux, i.e., the temperature gap in the metal sheets 10, 11. Consequently, high electric power can be outputted.

Figure 9:
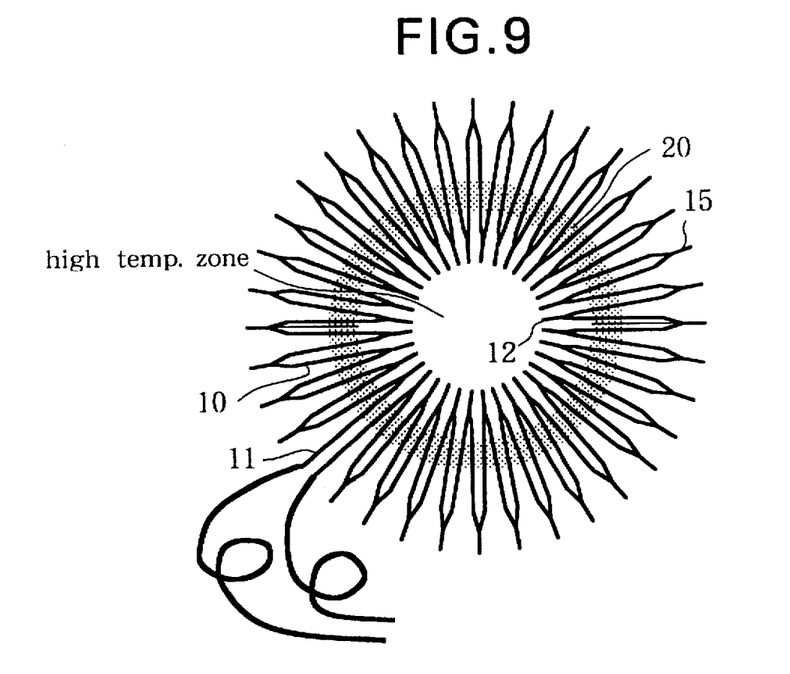
FIG. 9 is a sectional view illustrating a tubular thermo-electric power generator embedded in an exhaust pipe.

The metal sheets, or foils, 10, 11 may be embedded in the partition wall 20 to separate a high-temperature zone from a low-temperature zone, as shown in FIG. 9. In this case, the hot junctions 12 and the cold junctions 15 are preferably projected to the high-temperature atmosphere and the low-temperature atmosphere, respectively, so as to generate thermal flux in the metal sheets 10, 11. Due to this arrangement, the collection or discharging of heat at the high-temperature site is efficiently performed. This type element can be attached to an exhaust tube in an engine for an automobile or the like, to effectively recover heat as electric power from exhaust gas.

In order to promote heat exchange between the thermocouple pile and combustion gas, the thermocouple pile is preferably formed as a porous block having a big surface area. The surface area is made bigger by corrugating the metal sheets, or foils, and forming gas-permeable holes in the metal sheets, or foils.

Figure 10:
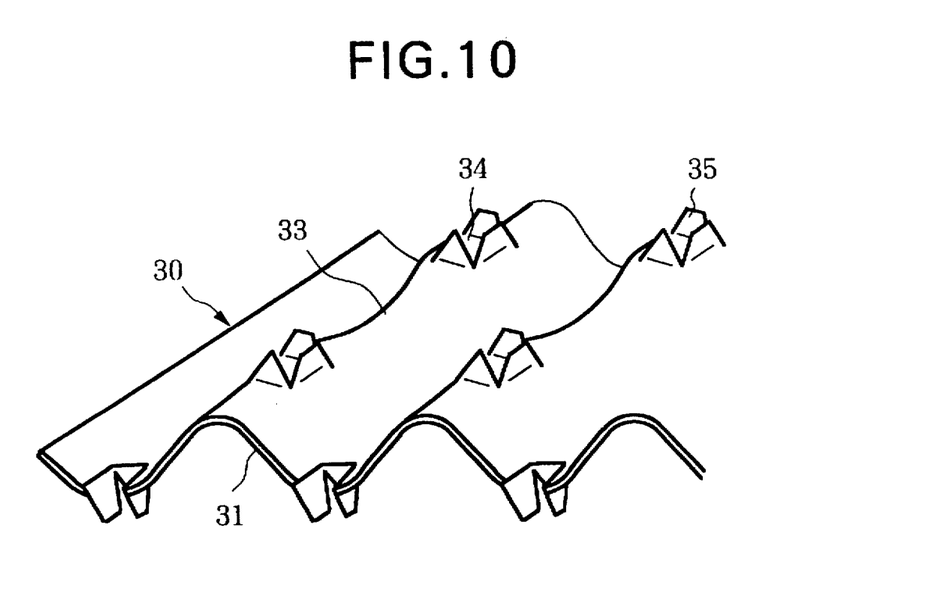
FIG. 10 is a view illustrating a corrugated sheet to be used in a thermo-electric power generator according to the present invention.
Figure 11:
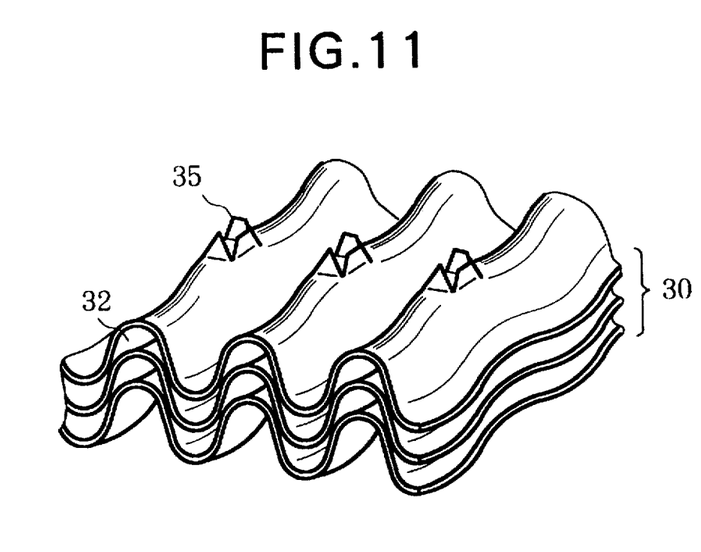
FIG. 11 is a view illustrating the lamination of corrugated sheets.

A metal sheet, or foil, 30 for forming the porous block is corrugated to the shape having a wave or concave-convex pattern 31, as shown in FIG. 10. When a plurality of corrugated sheets or foils 30 are laminated together, spaces 32 are formed between the adjacent sheets, or foils, 30, as shown in FIG. 11. The spaces 32 serve as the passages for combustion gas. When the wave or concave-convex pattern 31 is formed with wariness 33 along the longitudinal direction, the space 32 correspondingly fluctuates in cross-sectional area. Since the combustion gas passing through the spaces 32 is periodically expanded or compressed, the combustion gas flows in turbulent state through the spaces 32, so as to promote the heat exchange with the metal sheets 30.

Figure 12:
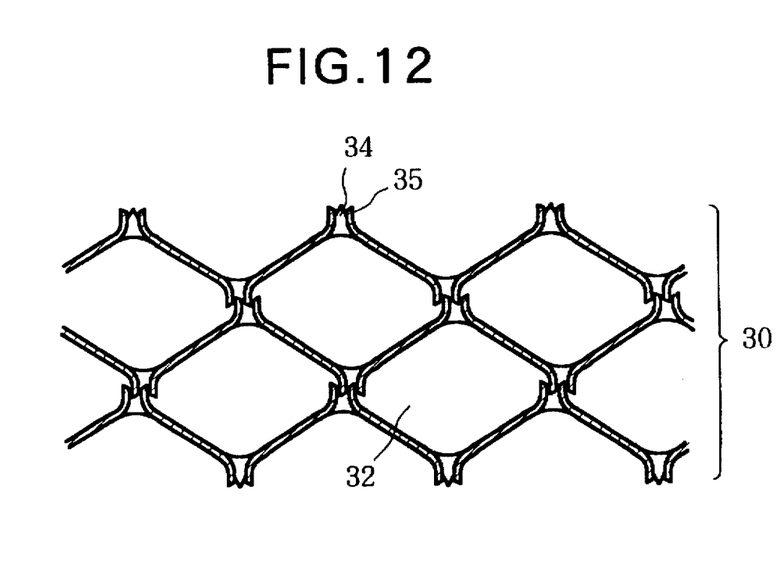
FIG. 12 is a sectional view illustrating the lamination of corrugated sheets.

Gas-permeable small holes 34 with projections 35 may be formed in each sheet 30. The projections 35 may be burrs formed by the formation of the holes 34. When the metal sheets, or foils, 30 are laminated together, the projections 35 are engaged with the adjacent sheets, or foils, 30, as shown in FIG. 12, so as to maintain the predetermined shape of the spaces 32. The holes 34 and the projections 35 are also effective for enlarging the surface area of the metal sheet 30.

The effective surface area of the metal sheet 30 may be increased by sand or bead blasting treatment to roughen the surface of the metal sheet 30.

Figure 13:
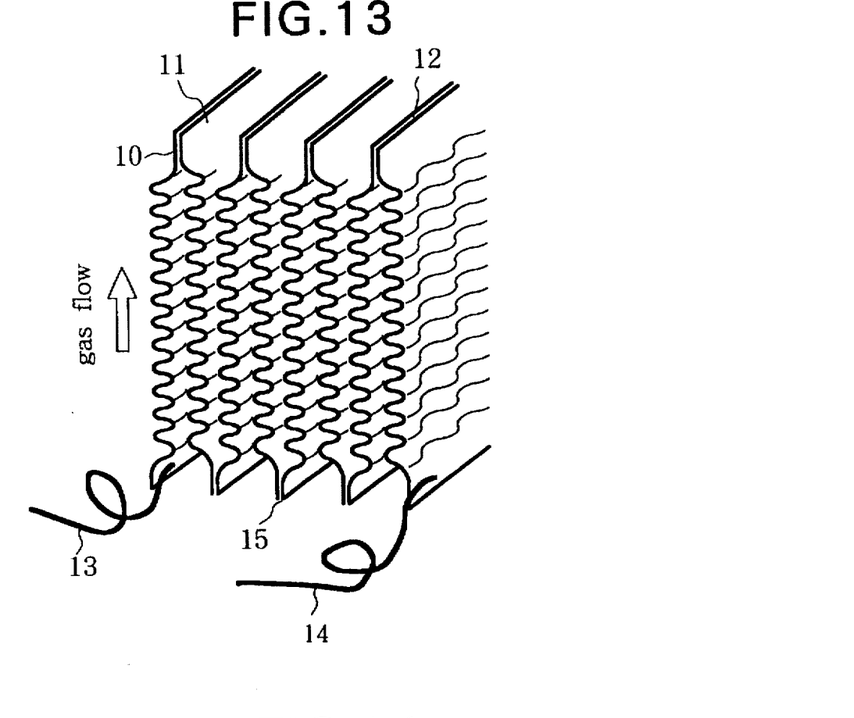
FIG. 13 is a view illustrating a thermo-electric power generating element made from corrugated sheets.

A plurality of corrugated sheets 10, 11 are laminated together and alternately connected at one end and the other end by welding, pressure welding, brazing or soldering, as shown in FIG. 13. After the metal sheets 10, 11 are formed in the zigzag-folded pattern, electrically insulating films are formed on the metal sheets 10, 11.

Figure 14:
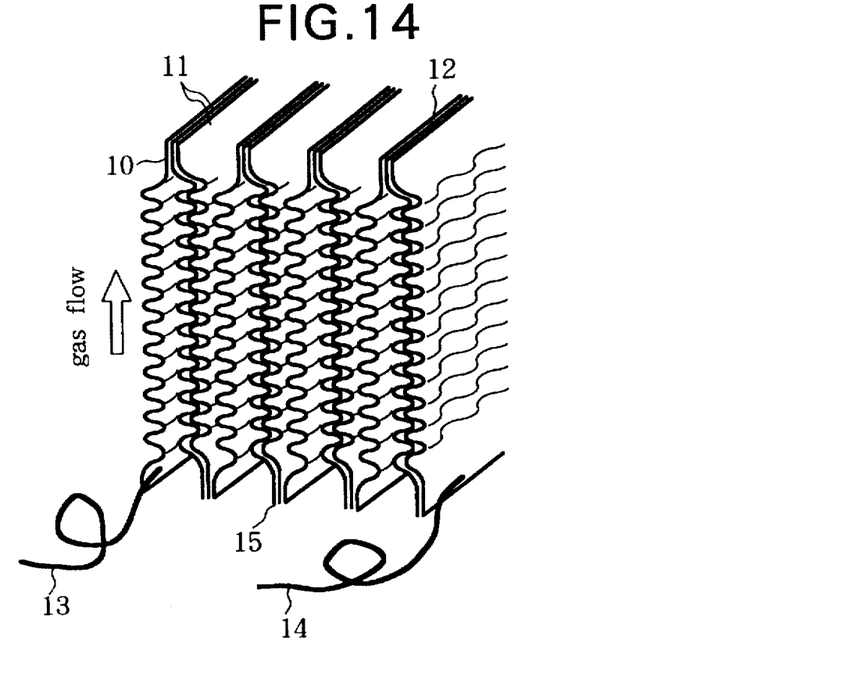
FIG. 14 is a view illustrating another thermo-electric power generating element made from corrugated sheets.
Figure 15:
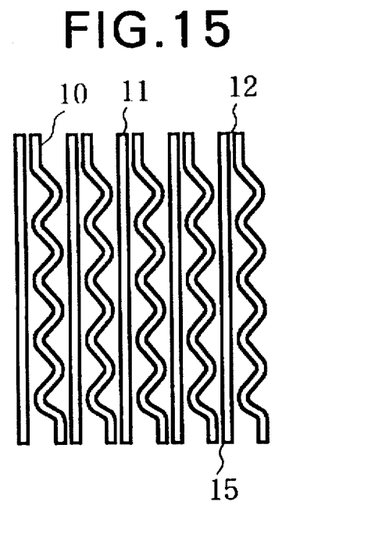
FIG. 15 is a sectional view for explaining one combination of metal sheets.
Figure 16:
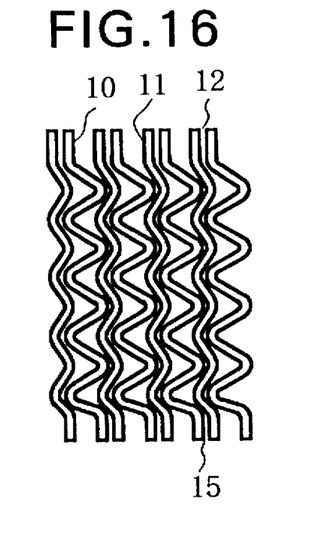
FIG. 16 is a sectional view for explaining another combination of metal sheets.

The corrugated sheets 10, 11 may be combined in various ways. For instance, one sheet 10 is connected to two sheets 11, as shown in FIG. 14. The corrugated sheets 10 are combined with flat sheets 11, as shown in FIG. 15. The corrugated sheets 10 are connected to the corrugated sheets 11 having different wave or concave-convex patterns, as shown in FIG. 16. The different patterns each effectively assures the presence of the spaces 32 (shown in FIG. 11) between the adjacent sheets 10 and 11.

Figure 17:
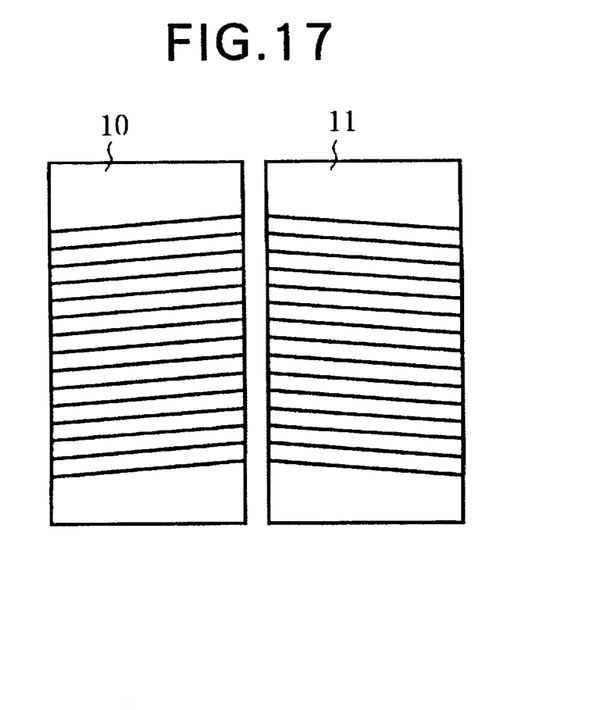
FIG. 17 is a plan view illustrating metal sheets having wave patterns extending along opposite directions.

The wave or concave-convex pattern formed in the sheets 10 preferably has a direction opposite to that of the pattern formed in the other sheets 11, as shown in FIG. 17. When the sheets 10, 11 are laminated together such that the wave pattern of the sheets 10 crosses the wave pattern of the sheets 11, the spaces within the lamination can be made higher and uniform over the whole body.

Figure 18:
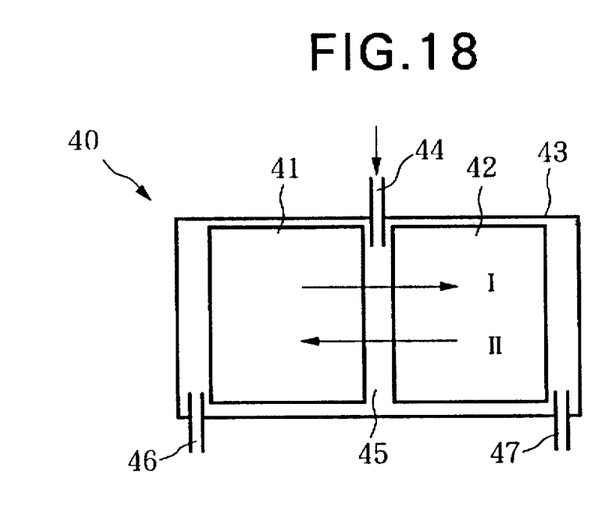
FIG. 18 is a schematic view for explaining a thermo-electric power generator having two porous blocks arranged in series.
Figure 19:
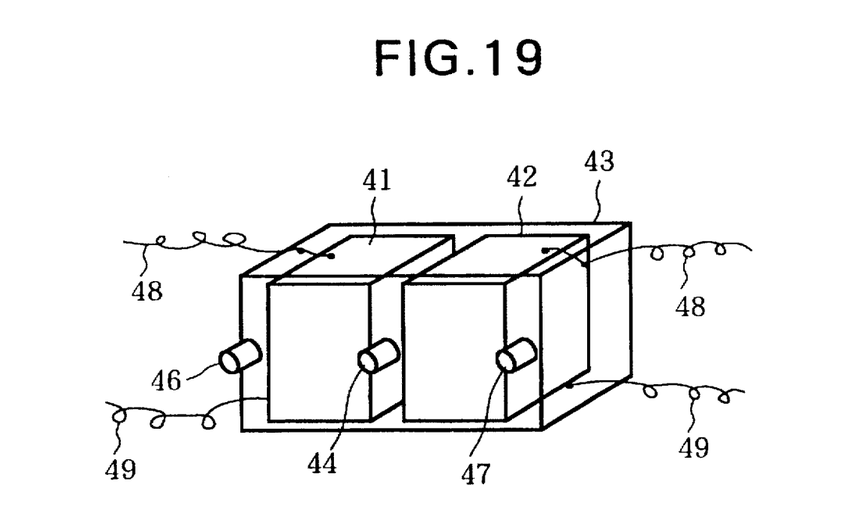
FIG. 19 is a perspective view illustrating the thermo-electric power generator shown in FIG. 18.

The conversion efficiency of heat to electric power can be improved by the system shown in FIGS. 18 and 19. This system 40 has a couple of porous blocks 41, 42 received in a combustion chamber 43 and arranged in series along the flowing direction of combustion improving gas or combustion gas. A fuel supply pipe 44 extends to a space 45 between the porous blocks 41 and 42.

A combustion improving gas, e.g., air, oxygen or oxygen-enriched gas, flows along the direction I through a supply-discharge pipe 46, the porous block 41, the space 45 and the other porous block 42 and then is discharged through another supply-discharge pipe 47, or along the reversed direction II. The flow direction is alternatingly switched between I and II in predetermined time intervals.

A fuel is supplied through the pipe 44 to the space 45 between the porous blocks 41 and 42 and burnt with the combustion improving gas fed out of the porous block 41 or 42. Combustion gas is discharged through the other porous block 42 or 41 and then the pipe 47 or 46.

Figure 20:
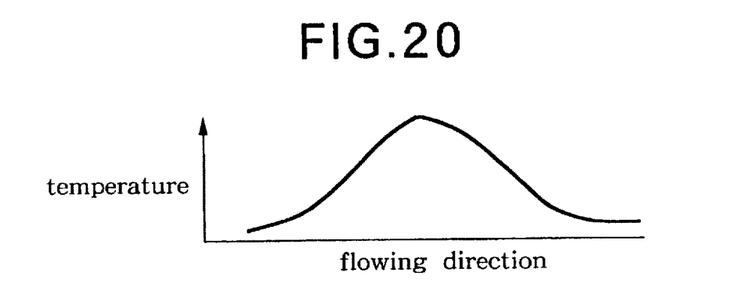
FIG. 20 is a graph explaining temperature distribution generated in the thermo-electric power generator.

Since the fuel supply line is separated from the combustion improving gas supply line, the combustion zone is limited to the narrow region defined by the space 45 and the inner parts of the porous blocks 41, 42 near the space 45. When the combustion improving gas flows along the direction I, the combustion improving gas is heated at a high temperature during passage through the porous block 41 and subsequently comes in contact with the fuel in the space 45, so that the fuel is instantaneously burnt with the high-temperature combustion improving gas in sufficient amount. As a result, the temperature gradation in the blocks 41, 42 becomes sharp, as shown in FIG. 20, so as to output high electric power through takeoff leads 48, 49.

Figure 21:
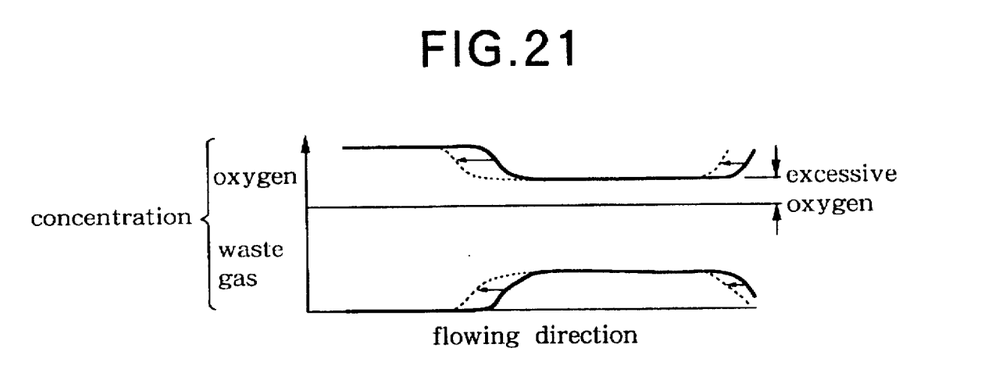
FIG. 21 is a graph explaining the distribution of oxygen and waste gas concentrations in the thermo-electric power generator.

The distribution of oxygen concentration along the flowing direction sharply dropped around the space 45, while the concentration of combustion gasses such as CO, $CO_2$ and $H_2O$ sharply increases around the space 45, as shown in FIG. 21. These sharp changes means that almost all the supplied fuel is burnt in the space 45, while the remaining fuel is burnt in the interior of the porous block 42 adjacent to the space 45. Consequently, the discharge of the supplied fuel in an unburnt state is inhibited.

Just after the flow of the combustion improving gas is switched from the direction I to II, the combustion improving gas returns from the porous block 42 to the porous block 41. The amount of oxygen necessary and sufficient for the combustion is maintained so as not to prevent the completion of the combustion due to the switching of the flow direction. In addition, since the fuel is supplied in small amount with dilute concentration, the combustion zone is held in stable state and limited to a narrow space, as shown in FIG. 22, without lowering its temperature even by supplying an unpreheated fuel to the space 45.

Figure 22:
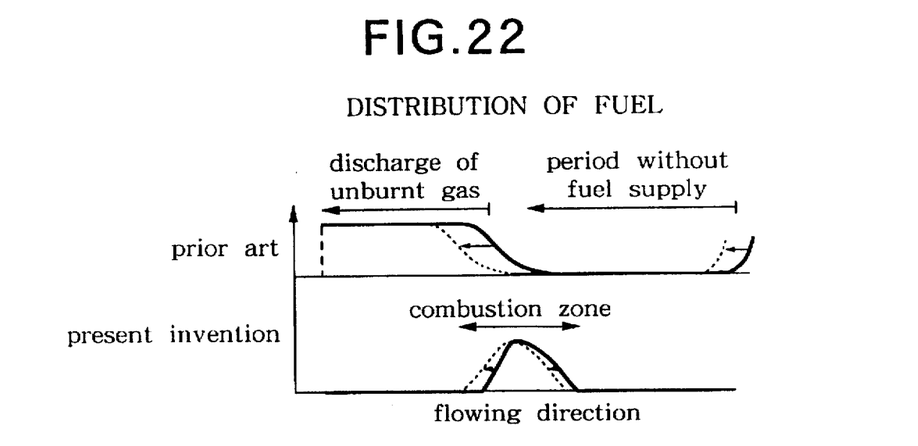
FIG. 22 is a graph explaining a combustion zone in the thermo-electric power generator according to the present invention, compared with a known thermo-electric power generator.

In contrast to the present invention, in a conventional system, as disclosed in Japanese Patent Application Laid-Open 6-302867, there is the period during which fuel is not supplied between the discharge of the combustion gas through the porous block and the arrival of a fuel gas supplied through the pipe at the combustion zone, as shown in FIG. 22. Therefore, the combustion is inevitably unstabilized, and unburnt fuel is discharged.

In the thermo-electric power generator having the aforementioned system of the present invention, the fuel is efficiently burnt without a discharge of unburnt gas after switching the flow direction, as in the conventional system. The supply of the fuel is not interrupted, and the combustion of the fuel is held in stable state. Consequently, electric power can be outputted with high efficiency through the takeoff leads 48, 49.

When the aggregate of metal meshes or wires are disposed in the space, the efficiency of combustion is further improved. The aggregate of the metal meshes or wires may be disposed as a unit body in the space or inserted in each of the porous blocks 41, 42 facing to the space 45. In this case, the fuel fed out of the pipe 46 comes in contact with the metal meshes or wires before entering into the porous block 41 or 42, so as to improve the efficiency of combustion.

In this thermo-electric power generator, the time intervals for switching the flow direction can be made shorter to the time period t for discharging the whole amount of air having oxygen concentration reduced by combustion. The time period t is determined by the formula of t=V/F, wherein V represents the capacity of the combustion chamber 43, and F the flow amount of gas. The switching intervals can be determined to the optimum value with the high degree of freedom. In contrast with the present invention, the consumption efficiency of fuel gas is dropped to approximately 50% in the conventional system, when the time intervals for switching the flowing direction is made short to the time period t (=V/F).

EXAMPLES

Example 1

The combination of ALUMEL (Ni-2Al alloy)/CHROMEL (Ni-10Cr alloy) having an output ratio P of $2-3 \times 10^{-3}$ W.m$^{-1}$.K$^{-2}$ was used as metal sheets 10, 11 in this example. After the metal sheets of 50 μm in thickness were corrugated to wave shape (shown in FIG. 10), the metal sheets were sheared to the dimensions of 50 mm×40 mm. The sheared ALUMEL and CHROMEL sheets, 32 pieces each, were laminated together, as shown in FIG. 11, and alternately connected at the upper end and the lower end by spot welding, as shown in FIG. 13. By this way, the metal sheets 10, 11 were connected together in zigzag-folded pattern, and 32 ALUMEL/CHROMEL thermocouples were connected in series.

Figure 23:
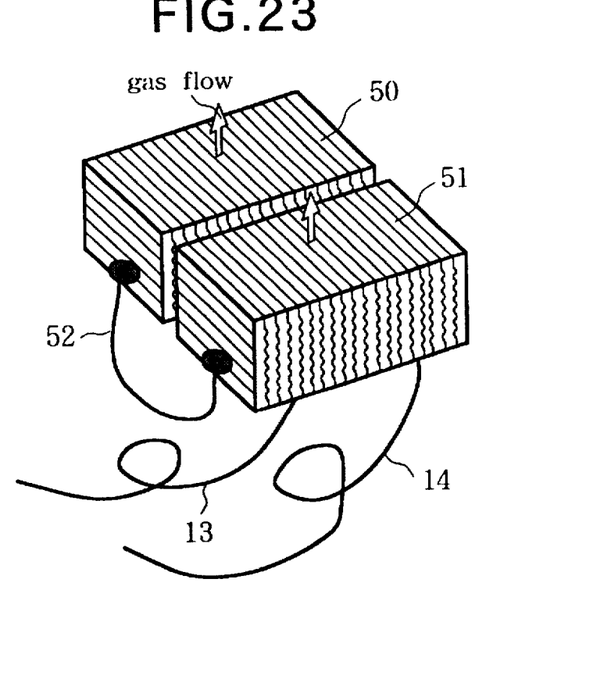
FIG. 23 is a view illustrating a thermo-electric power generating element in Example 1.

The obtained porous block was reformed to the shape having the sectional dimensions of 38 mm×38 mm with respect to the flowing direction of fuel gas. The reformed block was divided into two blocks 50, 51, as shown in FIG. 23. The blocks 50, 51 were connected in series through a U-shaped trunk electrode 52. As a result, 64 thermocouples were connected in series. Thereafter, the blocks 50, 51 were heated 45 minutes at 1000° C. in the open atmosphere so as to form electric insulating films composed of alumina and chromium oxide on the surface of the ALUMEL and CHROMEL sheets, respectively.

Takeoff leads 13, 14 were connected to the blocks 50, 51 at the side opposite to the trunk electrode 42 by spot welding. When electric resistance between the takeoff leads 13 and 14 was measured under the condition that pressure was applied onto the blocks 50, 51 along the folding direction, the deviation of electric resistance was not detected regardless the magnitude of pressure. The constant electric resistance means that each sheet was sufficiently insulated from the other sheets.

The porous blocks obtained in this way were inserted in a quartz tube having the inner dimensions of 40 mm×40 mm. LP gas in a flow amount of 0.2 l/minutes and air in a flow amount of 10 l/minutes were introduced into the quartz tube for combustion-power generating test. As a result, release voltage between terminals was E=2.0 V, and internal resistance during operation was $R_i$=5 Ω. It was understood from this result that the electric power of approximately 200 mW was outputted according to the formula of $P_{out}=E^2/4R_i$, when a load of 5 Ω was connected. It was calculated that the temperature gap of 750 K was generated in the porous blocks, since release voltage between terminals was approximately 31 mV per one thermocouple. These results means that the porous blocks according to the present invention had high performance similar to that of a thermo-electric power generator made of high-quality semiconductor material such as $FeSi_2$.

Example 2

ALUMEL and CHROMEL sheets were corrugated to form waves inclined with an angle of 5 degrees in opposite directions from each other. Small holes 34 were formed in the corrugated metal sheets 30. The ridges of the small holes 34 and projections 35 (shown in FIG. 10) at the surroundings were polished and rounded, so that burrs formed at the periphery of the hole 34 would not make a short circuit between the adjacent sheets. The metal sheets 10 were laminated alternately together with the other metal sheets 11 in the manner such that the waves extended to the opposite directions. Thereafter, the laminated metal sheets 10, 11 were formed into a porous block by the same way as that in Example 1. The porous block obtained in this way had 19 ALUMEL/CHROMEL thermocouples.

The porous block was used for making up a thermoelectric power generator by the same way as that in Example 1. LP gas in a flow amount of 0.1 l/minutes and air in a flow amount of 10 l/minutes were supplied into the quartz tube for combustion-power generating test. In this case, combustion was continued for a long period under uniform and stable condition over the whole body of the porous block. Release voltage between terminals was E=0.7 V, and internal resistance during operation was $R_i$=0.8 Ω. From these results, it is calculated that the electric power of approximately 150 mW was outputted, while the temperature gap of 890 K was generated in the porous block.

Example 3

The combination of ALUMEL/CHROMEL having the output ratio P of $2-3 \times 10^{-3}$ W/mK$^2$ were used as the metal sheets 10, 11. The ALUMEL and CHROMEL sheets 10, 11 of 50 μm in thickness were sheared to the dimensions of 50 mm×40 mm. The sheared ALUMEL and CHROMEL sheets, 41 pieces, each were alternately laminated, as shown in FIG. 3, and connected at the upper end and the lower end alternately by spot welding. As a result, the metal sheets 10, 11 were connected together in zigzag-folded pattern, and 41 ALUMEL/CHROMEL thermocouples were connected in series.

The folded bundle obtained in this way was reformed to a block of 10 mm in width, 5 mm in thickness and 40 mm in length. When this block was oxidatively heated 45 minutes at 1000° C. in the open atmosphere, dielectric alumina and chromium oxide films were formed on the surface of the ALUMEL and CHROMEL sheets, respectively.

Thereafter, takeoff leads 13, 14 were connected to both sides of the block. When electric resistance between the takeoff leads 13 and 14 was measured while applying pressure to the block along the folding direction, the deviation of the resistance with the magnitude of the applied pressure was not detected. This result means that each layer was sufficiently insulated from the other layers.

The obtained block was examined for power generating test, while folding its hot site at 650° C. and its cold site at 50° C. so as to make a temperature gap of 600 K. As a result, release voltage between terminals was E=1.0 V, and internal resistance during operation was $R_i$ =5 Ω. It was understood from these values that the electric power of 50 mW was outputted according to the relation of $P_{out}=E^2/4R_i$, when a load of 5 Ω was connected to the power generator.

Example 4

The same porous block as that in Example 1 was used as a thermo-electric power generating element in this example. The porous block prepared by shearing ALUMEL and CHROMEL sheets of 50 μm in thickness to the dimensions of 35 mm×40 mm, alternately laminating 31 pieces each of the sheared ALUMEL and CHROMEL sheets, and spot welding the ALUMEL and CHROMEL sheets at one end and the other end, alternately, so as to form the zigzag-folded pattern, wherein 31 thermocouples were connected in series. The porous block was of 40 mm in width, 40 mm in thickness and 35 mm in length. When the block was oxidatively heated 45 minutes at 1000° C. in the open atmosphere, dielectric alumina and chromium oxide films were formed on the surface of the ALUMEL and CHROMEL sheets, respectively.

Two thermo-electric power generating elements obtained in this way were received as porous blocks 41, 42 in a combustion chamber 43, as shown in FIGS. 18 and 19. A space 45 with the gap of 0.5 cm was disposed between the porous blocks 41 and 42. The porous blocks 41, 42 were positioned in the combustion chamber 43 in the manner such that takeoff leads 48, 49 were held at a cold site.

Air in a flow amount of 10 l/minute was supplied through the supply-discharge pipe 46 at one side, while a fuel gas in a flow amount equal to 3% of the air flow amount was supplied through the fuel supply pipe 44 into the space 45 and ignited. The porous blocks 41, 42 near the space 45 were heated by the combustion of the fuel. When the porous blocks 41, 42 were heated at a sufficiently high temperature, the flow amount of the fuel was reduced to approximately 1% of the air flow amount, and then the flow direction of the air was reversed. Thereafter, the flow direction of the air was periodically switched in the time intervals of approximately 5–10 seconds until stable combustion state.

Figure 24:
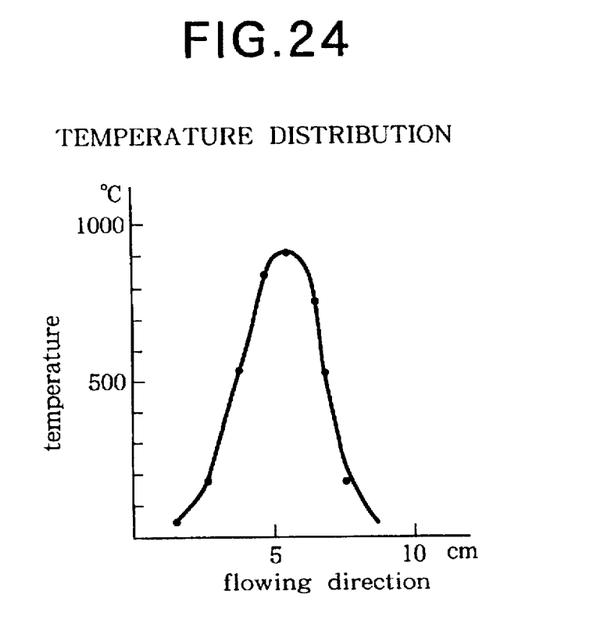
FIG. 24 is a graph for explaining temperature distribution along the flowing direction of combustion gas passing through porous blocks in Example 4.

Under the stable combustion condition, temperature distribution was generated with the temperature gap of approximately 900 K along the flowing direction, as shown in FIG. 24. Release voltage between terminals was of E=2 V, and internal resistance during operation was of R=1.6 Ω, when the takeoff leads 48, 49 at the blocks 41, 42 were connected in series. From these results, output power P was calculated to 625 mW according to the formula of $P=E^2/4R$.

The porous blocks 41, 42 used in this example had the cross section of 4 cm×4 cm and the length of 3.5 cm along the flowing direction of combustion gas. Since the porous blocks 41, 42 which were small in cross section were used, it was enough to locate the fuel supply pipe 44 facing to the space 45.

In the case where porous blocks large in cross section are used to enhance power generating efficiency, a metal pipe having a plurality of nozzles is preferably disposed in the space 45 in order to supply the fuel with uniform flow distribution into the space 45. A gas-permeable porous member made by aggregating metal meshes or wires is preferably disposed in the space 45 to make the burning reaction uniform and to keep the combustion under stable condition. Some metal meshes or wires catalytically accelerate the burning reaction so that the whole surface of the porous blocks 41, 42 as well as the space 45 are effectively used for the combustion of the fuel to make the temperature distribution uniform.

The thermo-electric power generating element according to the present invention as above-mentioned has the structure that a plurality of thermocouples are connected in series along temperature gradation. Due to this structure, electromotive forces at every thermocouple is summed up to a voltage level sufficient for outputting electric power, despite using materials having small electromotive force per one thermocouple.

In the case where corrugated metal sheets, or foils, are laminated to form the main body of the thermo-electric power generator, spaces serving as the passage of a fuel or combustion gas are formed between the adjacent sheets or foils. Since the spaces are properly controlled in size, direction and/or configuration by changing the wave or concave-convex pattern of the corrugated sheets, or foils, the specific surface area of the porous body are determined with a high degree of freedom so as to obtain the optimum combustion conditions with sharp temperature gradation. Consequently, high electric power is obtained in response to the sharp temperature gradation.

The power generator is useful for outputting electric power from the heat source, which has been wastefully discharged so far, such as waste heat from a blast furnace, a gas combustion oven, an automobile engine, an incinerator or solar heat. The bundle of zigzag-folded metal sheets, or foils, formed to a compact block is useful as a high-sensitive thermosensor since electricity is gained with high voltage.

The thermo-electric power generating element according to the present invention uses the metallic materials which have been industrially produced at low costs. Therefore, the thermo-electric power generator with high performance can be offered at a low cost.

What is claimed is:

1. A thermo-electric power generating element comprising:
    a thermocouple pile having a gas permeable structure formed by laminating two kinds of perforated metal sheets together such that cavities are formed between adjacent sheets, said sheets connected at one end and the other end alternatively so as to form a plurality of thermocouples connected in series in a zigzag-folded pattern, and said sheets insulated from each other,
    and takeoff leads connected to both ends of said thermocouple pile.

2. The thermo-electric power generating element according to claim 1, wherein said two kinds of metal sheets are selected from the group consisting of combinations of Ni-2 AL alloy/Ni-10Cr alloy, iron/60% Cu-40% Ni alloy and Ni-10Cr alloy/60% Cu-40% Ni alloy.

3. The thermo-electric power generating element according to claim 1, wherein said two kinds of metal sheets have an output rate P of at least $1 \times 10^{-3}$, where P is defined by the formula of: $P = \alpha^2/\rho$ wherein $\alpha$ represents a Zeebeck coefficient and $\rho$ is electric resistivity.

4. A thermo-electric power generating element comprising:

a thermocouple pile formed by laminating two kinds of perforated metal sheets together, said sheets connected at one end and the other end alternatively so as to form a plurality of thermocouples connected in series in a zigzag-folded pattern and said sheets insulated from each other, wherein said sheets are corrugated, and takeoff leads connected to both ends of said thermocouple pile.

5. The thermo-electric power generating element according to claim 4, wherein said sheets have gas-permeable holes formed with projections.

6. The thermo-electric power generating element according to claim 4, wherein said corrugated shapes of the two kinds of sheets are inclined along directions opposite to each other.

7. A thermo-electric power generator comprising:

two blocks made of thermocouple piles formed by laminating two kinds of metal sheets together, said sheets connected at one end and the other end alternatively so as to form a plurality of thermocouples connected in series in a zigzag-folded pattern, and said sheets insulated from each other, takeoff leads connected to cold sides of said two blocks, a combustion chamber receiving said two blocks therein in series along a flow direction of a combustion improving gas, a fuel supply pipe opened to a space within said combustion chamber between said two blocks, and means for supplying the combustion improving gas through said two blocks and for alternatively switching the flow direction of the combustion improving gas at predetermined time intervals, wherein fuel supplied through said fuel supply pipe is burnt with the combustion improving gas fed out of one said block and resultant combustion products are discharged through the other said block.

8. The thermo-electric power generator according to claim 7, wherein said fuel supply pipe has a plurality of nozzle openings at its top part extending into said space between said two blocks.

9. The thermo-electric power generator according to claim 7, wherein said space between said two blocks is filled with metal meshes or wires.

10. The thermo-electric power generator according to claim 7, wherein said metal sheets are corrugated.

11. The thermo-electric power generator according to claim 7, wherein each of said blocks has a gas permeable structure formed by laminating two kinds of perforated metal sheets in a manner such that cavities are formed between adjacent sheets.

* * * * *

UNITED STATES PATENT AND TRADEMARK OFFICE
CERTIFICATE OF CORRECTION

PATENT NO. : 5,726,380
DATED : March 10, 1998
INVENTOR(S) : Michio Ozutsumi et al.

It is certified that error appears in the above-identified patent and that said Letters Patent is hereby corrected as shown below:

Column 5 Line 44 "wariness" should read --waviness--.

Column 11 Line 10 Claim 3 "Zeebeck" should read --Seebeck--.

Signed and Sealed this

Twenty-first Day of July, 1998

*Attest:*

*Attesting Officer*

BRUCE LEHMAN

*Commissioner of Patents and Trademarks*